(12) United States Patent
Schafbauer

(10) Patent No.: US 6,750,122 B1
(45) Date of Patent: Jun. 15, 2004

(54) SEMICONDUCTOR DEVICE FORMED WITH AN OXYGEN IMPLANT STEP

(75) Inventor: Thomas Schafbauer, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/407,439

(22) Filed: Sep. 29, 1999

(51) Int. Cl.$^7$ ............... H01L 21/20; H01L 21/425; H01L 21/4163; H01L 21/44
(52) U.S. Cl. ............... 438/491; 438/532; 438/637; 438/659
(58) Field of Search ............... 438/491, 532, 438/657, 659; 257/E21.061, E21.059

(56) References Cited

U.S. PATENT DOCUMENTS

| | | | |
|---|---|---|---|
| 4,417,385 A | * 11/1983 | Temple | 29/571 |
| 5,378,641 A | * 1/1995 | Cheffings | 437/35 |
| 5,429,960 A | * 7/1995 | Hong | 437/35 |
| 5,508,215 A | * 4/1996 | Jeng | 437/38 |
| 5,606,521 A | * 2/1997 | Kuo et al. | 365/149 |
| 5,679,968 A | * 10/1997 | Smayling | 257/213 |
| 5,712,186 A | 1/1998 | Thakur et al. | 437/69 |
| 5,770,502 A | 6/1998 | Lee | 438/264 |
| 5,858,845 A | * 1/1999 | Cheffings | 438/302 |
| 5,930,659 A | 7/1999 | Klein et al. | 438/491 |
| 5,936,286 A | * 8/1999 | Sun | 257/369 |
| 5,976,937 A | * 11/1999 | Rodder et al. | 438/275 |
| 5,976,960 A | * 11/1999 | Cheffings | 438/525 |
| 6,001,709 A | * 12/1999 | Chuang et al. | 438/440 |
| 6,077,749 A | * 6/2000 | Gardner et al. | 438/299 |
| 6,200,836 B1 | * 3/2001 | Yoo | 438/163 |

FOREIGN PATENT DOCUMENTS

JP  6-163916  * 6/1994

OTHER PUBLICATIONS

T. Kuroi et al., Novel NICE . . . 0.25 um Dual agte CMOS, 1993, IEDM vol. 93, pp. 325–328.*
Whitehead N.J. et al., Effect of N–type . . . in GaAs, 1990, Electronics Letters, vol. 26 No. 13 pp. 866–869.*
M.E. Twigg, Characterization . . . Oxygen implantation, 1993, IEEE, pp. 50–51.*
S. Kusunoki et al., Hot–Carrier..LDD Mosfets, 1991, IEDM vol. 91, pp. 649–652.*
Yoshio Okada, The Performance . . . Using Mixtures of N2O and O2, IEEE Transactions on Electron Devices, vol. 41, No. 2, Feb. 1994, 191–197.*
M.J. Lederer et al., Nonlinear optical properties of ion–implanted GaAs, IEEE 151–153.*

* cited by examiner

*Primary Examiner*—Long Pham
*Assistant Examiner*—Shrinivas Rao
(74) *Attorney, Agent, or Firm*—Slater & Matsil L.L.P.

(57) ABSTRACT

A method of forming a semiconductor structure (see e.g., FIG. 3) includes forming a silicon (e.g., polysilicon) layer 14. The silicon layer 14 is patterned and etched so that at least one sidewall 20 is exposed. An oxygen bearing species (e.g., $O_2^+$) is then implanted into the sidewall 20 of the silicon layer 14. In the preferred embodiment, the oxygen bearing species is implanted at an acute angle relative to the plane of the silicon layer 14.

26 Claims, 2 Drawing Sheets

SEMICONDUCTOR DEVICE FORMED WITH AN OXYGEN IMPLANT STEP

FIELD OF THE INVENTION

The present invention relates generally semiconductor devices and more particularly to a semiconductor device formed with an oxygen implant step.

BACKGROUND OF THE INVENTION

Semiconductor devices are now found in almost all aspects of our lives. These products can be fabricated using any number of technologies including CMOS (complementary metal oxide semiconductor), bipolar, BiCMOS, and others. CMOS, as well as other MOS technologies, utilize field effect transistors (FETs). A field effect transistor includes two doped semiconductor regions, the source and drain, that are separated by a channel region. The conductivity of the channel region is actuated by a gate that typically overlies the channel.

To form a field effect transistor, a gate dielectric is deposited over a semiconductor substrate. A gate layer, typically of doped polysilicon is then deposited over the gate dielectric. The gate layer, and possibly the gate dielectric layer, are then etched to form the gate. After gate formation, the source and drain regions are implanted, using the gate as a mask to prevent the dopants from entering the channel region.

Many variations of this process are known. For example, a lightly doped drain (and/or source) can be formed. One way to form this region is to lightly dope the substrate using the gate as a mask. A sidewall spacer can then be formed over a portion of the lightly doped region. The more heavily doped source and drain regions can then be formed by implanting impurities using both the gate and the sidewall spacers as a mask. In another known process, the lightly doped drain can be formed by using a tilt angle implant process. Using an angle less than 90° relative to the plane of the substrate, impurities can be located closer to the channel than the source/drain implant that is performed at substantially 90°.

SUMMARY OF THE INVENTION

The present invention provides a useful improvement for the formation of semiconductor devices. In particular, but certainly not exclusively, transistor devices used at the input and/or output of a semiconductor chip can benefit.

In a first embodiment, a transistor device includes first and second source/drain regions disposed in a semiconductor body and separated by a channel region. A gate overlies at least a portion of the channel region and is separated from the channel by a gate oxide. The gate oxide includes a thick portion beneath the gate adjacent a sidewall and has a substantially uniform thickness in other regions beneath the gate. In the preferred embodiment, the thick portion is at least about 1.2 times thicker than the substantially uniform thickness.

In another aspect, the present invention teaches a method of forming a semiconductor structure, which may or may not be a transistor device. In this embodiment, a silicon layer is formed and then patterned and etched to expose at least one sidewall. An oxygen bearing species, e.g., $O_2$ or others, is then implanted into the sidewall of the silicon layer. The oxygen bearing species is implanted at an acute angle relative to the plane of the silicon layer.

When this method is applied to a transistor device, a number of advantages can be achieved. For example, the thick portion of the gate oxide that results provides for greater reliability. The oxygen implant yields a higher controllability of oxide corner rounding. The implant also provides a greater thickness and an easier adjustment with a low thermal budget than is possible using other techniques such as thermal oxidation of the gate stack. With the present invention, the implant angle, dose and energy can be optimized.

BRIEF DESCRIPTION OF THE DRAWINGS

The above features of the present invention will be more clearly understood from consideration of the following descriptions in connection with accompanying drawings in which.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

The present invention will be discussed in the context of a specific application, namely a field effect transistor. It should be recognized, however, that the invention can also be used in a variety of other contexts. Some of these alternative applications will be described below.

One of the goals of the semiconductor industry is to build faster and smaller devices. Higher integration of silicon technologies requires thinner gate dielectrics to improve, or at least maintain, the same on-currents. The thinner gate dielectrics leads to the desire to lower the internal voltages, e.g., by about thirty percent.

Unfortunately, the systems that utilize these devices often operate at the higher voltages. For example, external I/O (input/output) interface requirements for bus systems like PCI (peripheral component interface) and SCSI (small computer system interface) have standard requirements that apply to all devices coupled to the bus, regardless of the level of integration of any particular device. In some cases, such as with SCSI, these requirements cause high voltage conditions between the drain and gate for a limited time. The reliability of these devices can therefore be sacrificed since the device life time can be limited by gate-oxide failures.

The present invention provides a semiconductor device that, among other things, should reduce these failures. In one aspect, the gate dielectric becomes thicker nearer to the edge of the gate. This is the region, adjacent the channel/source-drain interface, that experiences a high electric field during operation.

FIGS. 1–5 provide a first embodiment process flow that can be used to form a semiconductor device that includes the improved gate dielectric.

Figure 1:
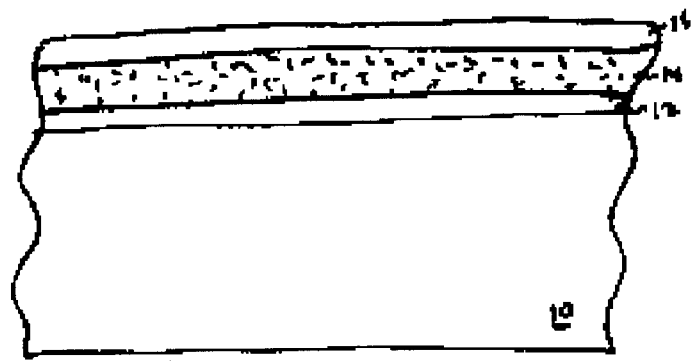
FIGS. 1–5 are cross-sectional views of a transistor device that is formed using a preferred embodiment process.

Referring first to FIG. 1, a semiconductor body 10 is provided. In the figures, semiconductor body 10 is shown as a semiconductor substrate. In other embodiments, semiconductor body 10 can be an epitaxially layer grown on either a semiconductor or an insulator (e.g., silicon-on-insulator or silicon-on-sapphire). Semiconductor body 10 can also be a doped layer formed in another semiconductor layer such as a well region (or a tub or tank region). Semiconductor body 10 is typically formed from silicon but other semiconductor materials could alternatively be used.

A gate dielectric layer 12 is formed on the semiconductor body 10. The gate dielectric layer 12 preferably comprises a silicon dioxide layer. In other embodiments, gate dielectric layer 12 may comprise a nitride layer (e.g., $Si_3N_4$). Combinations of oxide and nitride layers are also possible. In the preferred embodiment, gate dielectric layer 12 is formed by thermal oxidation of silicon in an oxygen containing gas, e.g. $O_2$, NO or $N_2O$. In typical embodiments, gate dielectric layer 12 has a thickness between about 1 nm and about 16 nm.

Gate layer 14 is formed over the gate dielectric layer 12. In the preferred embodiment, gate layer 14 is formed by depositing polysilicon. The polysilicon can be doped in situ or after deposition. In typical embodiments, gate layer 14 is between about 100 nm and about 400 nm in thickness.

FIG. 1 also illustrates a dielectric layer 16 formed over the gate layer 14. In the preferred embodiment, dielectric layer 16 is formed by the decomposition of tetraethyoxysilane (TEOS). This layer 16 is included as an etching hard mask, and may be left out if desired.

Figure 2:
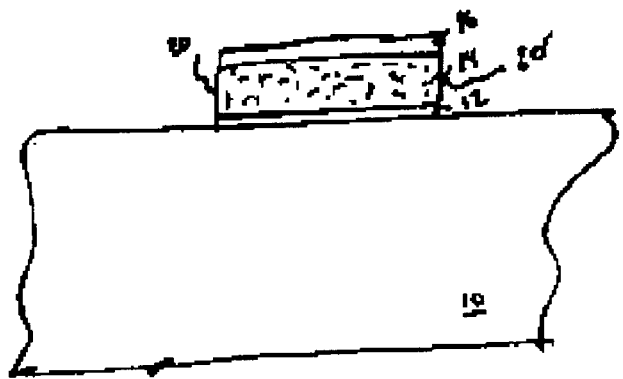

The gate stack, including gate dielectric layer 12, gate layer 14 and cap layer 16, is then patterned and etched using known photlithographic techniques. The resulting gate structure is shown in FIG. 2. The gate structure can take on any of a number of shapes, as is known in the art. FIG. 2 shows two sidewalls 20 at the vertical edge of gate 14. These sidewalls are typically perpendicular to the plane of semiconductor body 10.

In the preferred embodiment, a gate reoxidation step is performed after the gate 14 is etched. This step will create a thin oxide layer (not shown) on the outside of the polysilicon gate 14. This thin oxide layer is typically about 5 to 6 nm thick.

Figure 3:
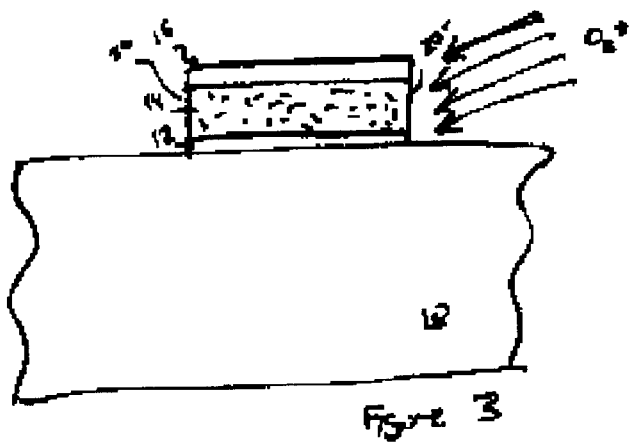
Figure 4:
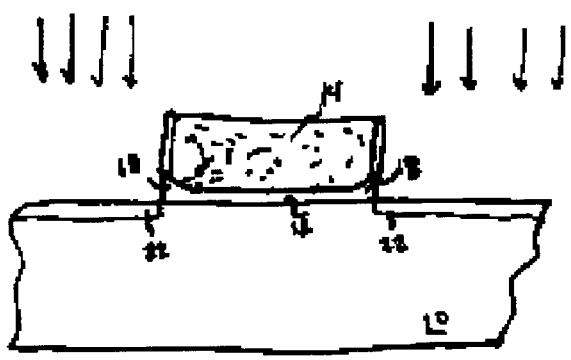

Referring next to FIG. 3, an angled oxygen implant is now performed. In this step, an oxygen bearing species is implanted into the transistor device. This implant is a tilt angle implant process. In other words, the oxygen bearing species is implanted at an acute angle relative to the plane of semiconductor body 10. In the preferred embodiment, the acute angle is typically between about 7° and 50°, and preferably about 30°.

The tilt angle implant process can be performed by physically tilting either the wafer or the ion source (or both). In the preferred embodiment, the wafer is tilted. The wafer can then be rotated during the implant process so that the oxygen bearing species is implanted around the gate structure. Alternatively, a first implant step could be directed toward sidewall 20 while a second implant step is directed toward sidewall 20'.

It is also possible to implant the oxygen just on one side of the gate, so that one side of the stack receives a thicker gate oxide. This is useful for asymmetric operation e.g. for buses, where there is a higher voltage applied usually just on one side.

A number of materials can be used as the oxygen bearing species. In the preferred embodiment, the oxygen bearing species is $O_2$. In other embodiments, materials such as $N_2O$, NO, atomic oxygen, $H_2O$ in neutral or ionized form can be used. It is also possible to use combinations of any of these materials.

In the preferred embodiment process, $O_2$ is implanted with an energy between about 20 keV and 30 about keV. The preferred implant dose is between about $1 \times 10^{14}$ cm$^{-2}$ and about $5 \times 10^{15}$ cm$^{-2}$. These parameters can be appropriately adjusted for different species.

After the implant or at a later process step during the manufacturing, a temperature of typically more than 700° C. is applied to the wafer, which causes the implanted oxide to increase the oxide thickness mostly near the edge of the stack.

The implanted oxygen will cause an increased gate oxide thickness at the edges of the gate stack. This increased thickness portion of gate oxide layer 12 is labeled with reference numeral 18 in FIG. 4. The rounding on the side of the gate stack is controllable by the dose of the oxygen implant. This invention provides the feature that the implant angle, dose and energy can be optimized for a specific application.

The inclusion of the oxygen implant step provides at least two benefits for the device behavior. First, since a thicker gate oxide results in a higher threshold voltage, the threshold voltage increases when the polysilicon length is shorter (critical dimension tolerance). As a result, the short-channel roll-off (threshold voltage vs. device length) is reduced.

Of more significance, the gate oxide reliability is improved for voltage conditions where the voltage between the gate and drain or source is high. This condition is typically the case for I/O applications, when a high external voltage must be sustained for a limited life time.

In a typical embodiment, the thicker portion 18 is between about 1.1 and 3.5 times thicker than the remainder of the gate oxide 12. Preferably, the thicker portion 18 is at least 1.2 times greater than the remainder. In certain embodiments, thicker portion 18 may be 1.5 or 2.0 times thicker than the remainder. For example, if the gate oxide 12 is about 6.8 nm thick than the thicker portion would be about 9.0 nm thick (or about 1.3 times greater in this example). It is noted that this thickness could not typically be achieved using other processes such as thermal oxidation of the sidewall 20 without degrading the device behavior due to an increased thermal budget.

Using an implantation step to enhance the oxide thickness at the edge of the gate stack provides other advantages. Since the implantation can be masked, only selected ones of the devices can be modified while the others do not receive this processing. This selective modification cannot be performed with thermal oxidation. As an example, the modification can be performed on each of the I/O transistors but not on the circuitry within the device.

The oxide implant step is typically followed by a thermal step. During this thermal step, the oxide is recrystallized and any implantation damage to the substrate is corrected. The step can be performed using a rapid thermal anneal (RTA) to about 1000° C. for about 10 seconds.

Returning to FIG. 4, the formation of a transistor device can be continued. Lightly doped source/drain regions 22 are formed by implanting impurities using gate 14 as a mask. These impurities are typically implanted at an angle normal to the plane of semiconductor body 10. It is understood that this normal angle may not, in practice, be exactly 90°. Therefore, in the context of this patent, a tilt angle implant is performed at an acute angle that is less than the normal angle that is used to implant the source and drain regions. That being said, it should be understood that the lightly doped source/drain regions could be formed using a tilt angle implant. In that case, this particular implant would not be performed at an angle normal to the plane of semiconductor body 10.

In the preferred embodiment, the oxide implant step is performed before the source/drain formation. These steps, however, could be reversed.

Figure 5:
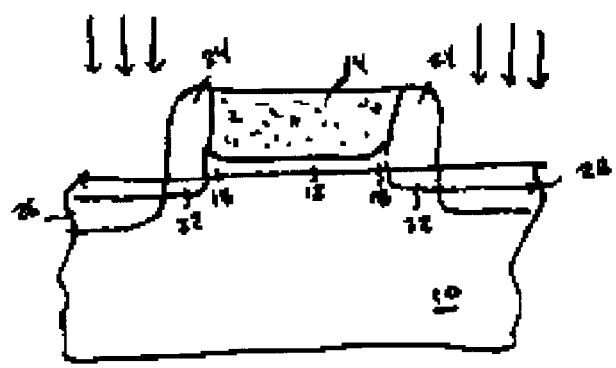

Referring next to FIG. 5, sidewall spacers 24 are formed using standard processes. For example, a thick conformal oxide layer could be deposited over the surface of the device. An anisotropic etch could then be performed to create the sidewall spacers 24. This process is well known in the art.

Source/drain regions 26 are then formed by implanting impurities using the gate 14 and sidewall spacers as a mask. The resulting structure is a MOS transistor. This transistor can be either n-channel or p-channel, as known in the art. As also known in the art, CMOS devices include both n- and p-channel transistors.

It is noted that the figures only illustrate a single transistor device. As is known, typical devices have many, e.g., millions, of transistors. These different devices can be isolated from one another using a variety of techniques including field oxide isolation, trench isolation and field plate isolation. The different transistors are typically connected using conductive, e.g., polysilicon or metal, lines. For the sake of simplicity, the isolation, contacts and conductive lines have not been illustrated.

The present invention has been described in the context of a very simple transistor device. Transistor devices can be fabricated with a wide variety of modifications and improvements. It should be understood that the breadth of the present invention should not be limited because it has been described in the context of an extremely simple device.

It should also be understood that the present invention could be utilized in a variety of different contexts. For example, FIG. 6 illustrates a floating-gate non-volatile device, such as would be utilized in an EPROM (erasable programmable read only memory) or EEPROM (electrically erasable programmable read only memory).

Figure 6:
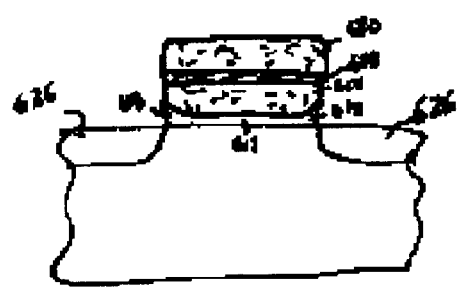
FIG. 6 is a cross-sectional view of a floating gate device that utilizes aspects of the present invention.

Referring to FIG. 6, the floating gate device includes two gate regions-floating gate 614 and control gate 630. These regions are separated by dielectric layer 628. The process for forming a floating gate device is similar to that of an MOS device and will not be discussed here.

Another field of application is the use in embedded technologies, such as embedded Flash, embedded DRAM or BiCMOS, where the formation of a thicker gate oxide could disturb the modularity of the process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a MOS transistor, the method comprising:

forming a silicon gate layer over an oxide layer, the silicon gate layer defining a plane;

depositing the oxide layer prior to forming the silicon gate layer, the oxide layer having a substantially uniform thickness, wherein the substantially uniform thickness is between about 1 nm and 16 nm;

patterning and etching the silicon gate layer so that at least one sidewall is exposed;

implanting an oxygen bearing species into the sidewall of the silicon gate layer, the oxygen bearing species being implanted at an acute angle relative to the plane of the silicon gate layer, wherein implanting an oxygen bearing species causes a portion of the oxide layer adjacent the sidewall of the silicon gate layer to be thicker than the substantially uniform thickness by a factor of about 1.5; and forming a source and a drain region adjacent to the silicon layer.

2. The method of claim 1 wherein the oxygen bearing species comprises $O_2$.

3. The method of claim 1 wherein the oxygen bearing species is selected from the group consisting of $N_2O$, NO, atomic, oxygen, $H_2O$ in neutral form, $H_2O$ in ionized form and combinations thereof.

4. A method of forming a transistor device, the method comprising:

providing a semiconductor body, the semiconductor body defining a plane;

forming a gate oxide layer over the semiconductor body;

forming a gate layer over the gate oxide layer;

patterning and etching the gate layer to form a gate, the gate including at least one sidewall portion;

implanting an oxygen bearing species into the sidewall portion of the gate, the oxygen bearing species being implanted at an acute angle relative to the plane of the semiconductor body;

forming at least one lightly doped source/drain region in the semiconductor body adjacent the gate;

forming a sidewall spacer overlying the lightly doped source/drain region; and forming source/drain regions in the semiconductor body and spaced by a channel region that underlies the gate, at least one of the source/drain regions being adjacent the at least one lightly doped source/drain region.

5. The method of claim 4 wherein the oxygen bearing species comprises $O_2$.

6. The method of claim 4 wherein the oxygen bearing species is selected form the group consisting of $N_2O$, NO, atomic oxygen, $H_2O$ in neutral form, $H_2O$ in ionized form and combinations thereof.

7. The method of claim 4 and further comprising the step of recrystallizing the gate oxide after implanting the oxygen bearing species.

8. The method of claim 4 and further comprising the step of heating the transistor device after implanting the oxygen bearing species.

9. The method of claim 4 and further comprising the step of forming a thin oxide on the gate after forming the gate and before implanting the oxygen bearing species.

10. The method of claim 4 wherein the step of implanting an oxygen bearing species is performed before the step of forming at least one lightly doped source/drain region.

11. The method of claim 4 wherein the step of forming at least one lightly doped source/drain region is performed before the step of implanting an oxygen bearing species.

12. A method for forming a transistor device, the method comprising:

forming a first source/drain region disposed in a semiconductor body;

forming a second source/drain region disposed in the semiconductor body;

forming a channel region disposed in the semiconductor body between the source and drain regions;

forming a gate overlying at least a portion of the channel region, the gate including at least one sidewall; and forming a gate oxide disposed between the gate and the channel region, the gate oxide including a thick portion beneath the gate adjacent the at least one sidewall, the gate oxide having a substantially uniform thickness in other regions beneath the gate, the thick portion being at least about 1.2 times thicker than the substantially uniform thickness;

wherein the gate oxide is formed by depositing a gate oxide layer prior to forming the gate and then, subsequent to forming the gate, implanting an oxygen bearing species into a sidewall region of the gate adjacent to the gate oxide.

13. The method of claim 12 wherein the gate is formed from doped polysilicon.

14. The method of claim 12 wherein the thick portion of the gate oxide is about 9 nm thick.

15. The method of claim 12 wherein the thick portion is at least about 1.5 times thicker than the substantially uniform thickness.

16. The method or claim 15 wherein the thick portion is at least about twice as thick as the substantially uniform thickness.

17. The method of claim 12 wherein the thick portion is between about 1.2 and about 3.5 times thicker than the substantially uniform thickness.

18. A method of forming a semiconductor device, the method comprising:

forming a gate oxide layer over a semiconductor body, the gate oxide layer being formed with a substantially uniform thickness;

forming a gate layer over the gate oxide layer;

patterning and etching the gate layer to form a gate, the gate including at least one sidewall;

subsequent to forming the gate layer, causing a portion of the gate oxide layer to become thicker than the substantially uniform thickness by implanting an oxygen bearing species into the at least one sidewall of the gate; and forming source/drain regions adjacent to the gate.

19. The method of claim 18 wherein causing a portion of the gate oxide layer to become thicker further includes heating the semiconductor device.

20. The method of claim 18 wherein causing a portion of the gate oxide layer to become thicker comprises causing a portion of the gate oxide layer to become at least 1.2 times thicker than the substantially uniform thickness.

21. The method of claim 1 wherein forming a silicon gate layer comprises depositing a polysilicon layer.

22. A method of forming a MOS transistor, the method comprising:

forming an oxide layer prior to forming the polysilicon gate layer, the oxide layer having a substantially uniform thickness, depositing a polysilicon gate layer, the polysilicon gate layer defining a plane;

patterning and etching the polysilicon gate layer so that at least one sidewall is exposed;

implanting an oxygen bearing species into the sidewall of the polysilicon gate layer, the oxygen bearing species being implanted at an acute angle relative to the plane of the polysilicon gate layer, wherein implanting an oxygen bearing species causes a portion of the oxide layer adjacent the sidewall of the polysilicon gate layer to be thicker than the substantially uniform thickness by a factor of about 1.5; and forming a source and a drain region adjacent the polysilicon gate layer.

23. The method of claim 22 wherein the oxygen bearing species comprises $O_2$.

24. The method of claim 22 wherein the oxygen bearing species is selected from the group consisting of $N_2O$, NO, atomic oxygen, $H_2O$ in neutral form, $H_2O$ in ionized form and combinations thereof.

25. The method of claim 24 wherein the acute angle is between about 7° and about 50°.

26. The method of claim 1 wherein the acute angle is between about 7° and about 50°.

* * * * *